United States Patent [19]
Van Zeeland et al.

[11] Patent Number: 5,482,092
[45] Date of Patent: Jan. 9, 1996

[54] NON-ROTATING WIRE ROUTING DEVICE AND METHOD

[75] Inventors: Alan C. Van Zeeland, Cortland; Louis J. Liguore, Poland, both of Ohio

[73] Assignee: General Motors Corporation, Detroit, Mich.

[21] Appl. No.: 937,027

[22] Filed: Aug. 31, 1992

[51] Int. Cl.⁶ ........................................ B21F 27/00
[52] U.S. Cl. .......................................... 140/92.1
[58] Field of Search .............................. 29/850; 140/92.1; 174/72 A, 72 B, 251; 361/406, 409

[56] References Cited

U.S. PATENT DOCUMENTS 4,593,452  6/1986  Keahey et al. .................... 140/92.1
4,603,476  8/1986  Tarbox ............................... 140/92.1
4,684,765  8/1987  Beck et al. ......................... 174/68.5
4,862,927  9/1989  Dorman et al. .................... 140/92.1

*Primary Examiner*—John Sipos
*Assistant Examiner*—Thomas C. Schoeffler
*Attorney, Agent, or Firm*—William A. Schuetz

[57] ABSTRACT

Wire is routed onto a bus plate by a wire routing device that comprises a wire feed mechanism and a non-rotatable wire routing head. The wire routing head has a horn that includes an inverted funnel shaped orifice. The wire feed mechanism pushes wire into the inverted funnel shaped orifice which routes the wire in wire receiving channels and passages of the bus plate in linear and non-linear patterns without any need for rotating the horn with respect to the bus plate.

22 Claims, 4 Drawing Sheets

NON-ROTATING WIRE ROUTING DEVICE AND METHOD

BACKGROUND OF THE INVENTION

This invention relates generally to the manufacture of routed wire assemblies and more particularly to a wire routing device and method for manufacturing electrical routed wire assemblies.

U.S. Pat. No. 4,684,765 granted to Lawrence R. Beck, Andrew J. Kocjan, Richard A. Natoli and Louis J. Liguore Aug. 4, 1987 discloses an electrical bus assembly of the routed wire type.

The patented electrical bus assembly (10) comprises a precision molded thermoplastic bus insulation plate (12) that has a base (14) with islands forming terminal stations (16) and guide stations (18) that are separated from each other to provide a network of wire receiving channels (20) that communicate with wire passages (26) that pass through the terminal and guide stations. Electrically conductive wires (42, 44, 46 and 48), preferably copper, are laid into the wire receiving channels (20) and wire passages (26) in preselected patterns. Terminal cavities (28) extend through the base (14) and intersect the wire passages (26) in the terminal stations (16). The electrical bus assembly (10) is put into an electrical connector assembly (80) and electrical blade terminals (86) are plugged into the electrical connector assembly with the electrically conductive wires (42, 44, 46 and 48) serving to splice a number of electrical blade terminals (86) together.

The method of routing the electrically conductive wires (42, 44, 46 and 48) into the wire receiving channels (20) and wire passages (26) of the plate (12) involves planting the end of a solid core copper wire into a hole (50) in the plate (12), and then moving the plate (12) under a rotary processor head (60) that contains a servo feed to plant the end of a solid core copper wire into a hole in the plate (12), a planting finger (68) to press the wire into the wire receiving channels (20) and wire passages (26) of the plate (12), and a cutter blade (72) to cut the wire at the terminal end.

The patented routed wire bus assembly and its method of manufacture have been successfully used by the Packard Electric Division of General Motors Corporation, the assignee of this invention for a number of years. However, there are certain areas that can be improved.

The rotary processor head (60) rotates every time that copper wire turns a corner. More specifically, when it is necessary for the copper wire to turn a corner, the table moves the plate (12) until it gets to the point of the desired corner and then it stops. The rotary processor head (60) then rotates 45 degrees. The table makes a short 45 degree move in the same direction that the rotary processor head (60) is now pointing. Then the table stops again. The rotary processor head (60) then rotates another 45 degree to complete the desired 90 degree turn. The table then moves the plate (12) onto the next corner or to the terminal end where the copper wire is cut. This cornering method requires a considerable amount of cycle time.

Moreover, in practice, the copper wire is pulled out of the rotary processor head (60) after the end is planted in the hole (50) and the plate (12) moves under the rotary processor head (60) for the planting finger (68) to press the wire into the channels (20) and passages (26) of the plate (12). This feature tends to stretch the copper wire and build up residual stress that resist firm planting of the wire as it turns corners.

SUMMARY OF THE INVENTION

The object of this invention is to provide an improved wiring routing device and method for manufacturing routed wire assemblies such as the electrical bus assembly that is the subject of U.S. Pat. No. 4,684,675.

A feature of the improved wire routing head and method is that the wire is routed by a non-rotatable head which reduces the complexity of the wire routing device and method significantly.

Another feature of the improved wire routing head and method is that the wire is routed around corners without any need for a rotating routing head which means that corners are turned easier and quicker during the wire routing process.

Yet another feature of the improved wire routing head and method is that the wire is pushed into position during the wire routing process which makes turning corners easier.

An important advantage of the improved wire routing device and method is that manufacturing cycle times are reduced significantly thereby reducing manufacturing cost significantly.

Another important advantage of the improved wire routing device and method is that wire is routed and planted without inducing any significant residual stress in the wire which improves durability and reliability of devices that are manufactured using the improved device and method.

BRIEF DESCRIPTION OF THE DRAWINGS

The above and other objects, features and advantages of the invention will become more apparent from the following description taken in conjunction with the accompanying drawings wherein like references refer to like parts and wherein.

DESCRIPTION OF THE INVENTION

Figure 1:
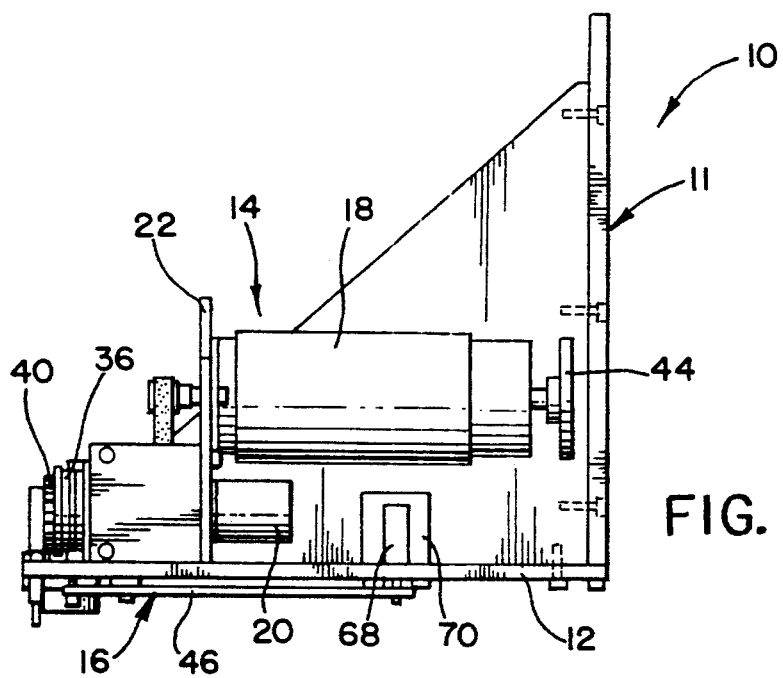
FIG. 1 is a side view of a non-rotating wire routing device in accordance with the invention.

Referring now to the drawing, the wire routing device 10 comprises a frame 11 that includes a base plate 12. The frame 11 is attached to a vertical slide of a machine (not shown) that has a bidirectional slide table that is located below the wire routing device 10. This table translates horizontally in two directions, that is, longitudinally along an X axis and transversely along a Y axis, with respect to the wire routing device 10 so that it can route wire onto a flat insulation plate or the like to produce the routed wire electrical bus assembly shown in FIG. 5. The frame 11 carries a locating device 13 to zero the table with respect to the wire routing device 10.

The base plate 12 supports a wire feed mechanism indicated generally at 14 above the plate and a wire routing head indicated generally at 16 below the plate.

Wire Feed Mechanism

The wire feed mechanism 14 includes an electric motor 18 and a resolver 20 that are supported on an upright mounting plate 22 attached to the frame 11. A bearing block 24 and side plates 26 are also attached to the frame 11 forming a housing in front of the electric motor 18 and resolver 20. A wire drive roller 28 is journalled in a bearing slide 30 carried by the bearing block 24. The wire drive roller 28 is driven by a pulley 32 that is belt driven by the electric motor 18.

The wire drive roller 28 is next to a wire guide 34 that attached to the face of the bearing block 24. A cooperating pressure roller 36 is journalled on the bearing block 24 and located on the opposite side of the wire guide 34. The rollers 28 and 36 engage opposite sides of wire 38 that is inserted into the wire guide 34 from a reel (not shown) and feed wire 38 from the reel (not shown) into the wire routing head 16.

The wire drive roller 28 and the cooperating pressure roller 36 carry meshing spur gears 40 so that the drive roller 28 drives the pressure roller 36 at the same speed during the wire feeding process. The pressure roller 36 is coupled to the resolver 20 by a spring coupling 42. The resolver 20 functions to measure the length of wire fed by the wire feed mechanism 14. The electric motor also has a gear 41 for manually actuating the wire feed mechanism 14.

The Wire Routing Head

The wire routing head 16 comprises a feed tube 42, a horn plate 44, a cutter blade 46 and a horn 48. The feed tube 42 extends through the base plate 12 and fits into the bottom of the wire guide 34 so that it receives wire 38 being fed by the wire feeder 14 above the base plate 12. The tip of the feed tube 42 projects beneath the base plate 12 and fits into a chamfer at the upper end of a bore that extends through the horn plate 44.

The horn plate 44 has a depending rib 50 that has two steps that provide an anvil riser 52 beneath an intermediate guide step 54. As indicated above, the horn plate 44 has a through bore 56 that is chamfered at its upper end to receive the tip of the feed tube 42. The through bore 56 opens onto the tread of the guide step 56 next to the anvil riser 52.

The cutter blade 46 has a hollow end 58 that is guided on the guide step 54. The hollow end 58 has a lower cutting edge 60 that cooperates with the anvil riser 52 to cut off wire that is being fed through the through bore 56. The cutter blade 46 has a pin 62 at its opposite end for operating the cutter blade 46 through a linkage that is described later.

The horn 48 is a disk shaped body that is fastened to the underside of the horn plate 44 over the depending rib 50 by machine screws or other suitable fasteners.

The horn 48 has a longitudinal slot 64 that receives the depending rib 50 and the cutting end of the cutter blade 46 when it is fastened in place.

Figure 4:
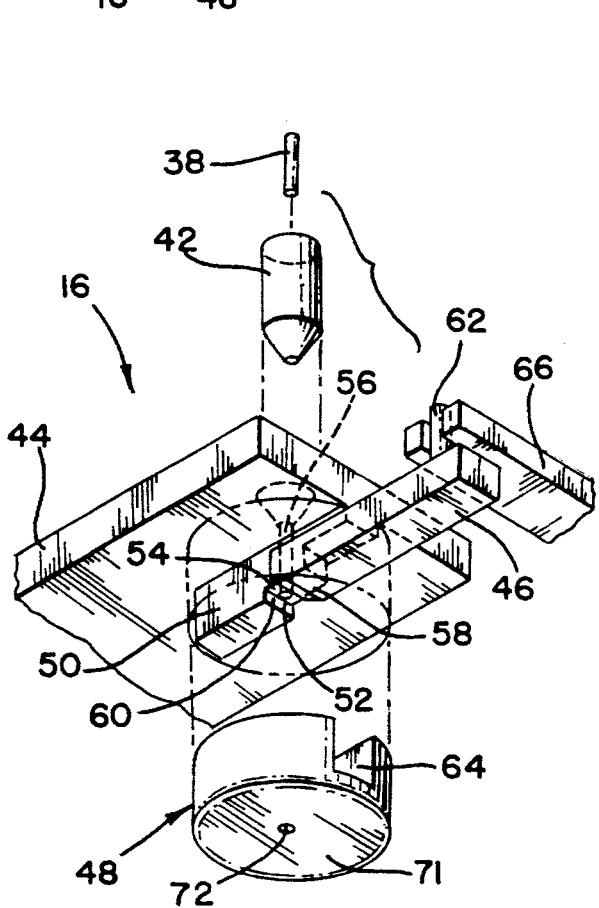
FIG. 4 is an enlarged, exploded perspective view of a portion of the non-rotating wire routing device that is shown in FIGS. 1, 2 and 3.
Figure 3:
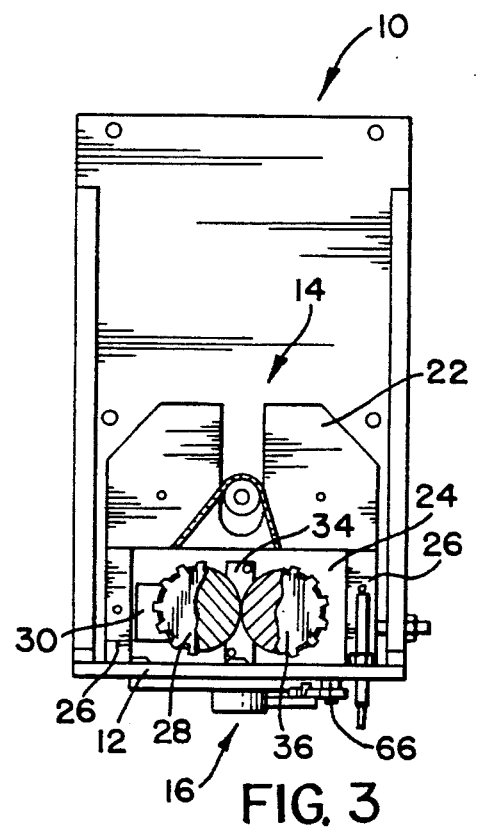
FIG. 3 is a front view of the non-rotating wire routing device that is shown in FIGS. 1 and 2.
Figure 2:
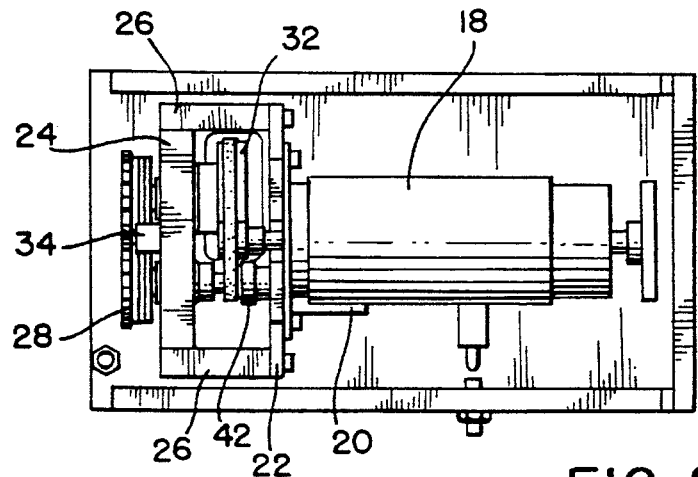
FIG. 2 is a partial top view of the non-rotating wire routing device shown in FIG. 1.

The cutter blade 46 reciprocates in the slot 64 guided by the guide step 54 that fits slidably into the hollow end 58 of the cutter blade 46. The cutter blade 46 is reciprocated by link 66 that is pivotally mounted beneath the base plate 12 between its ends, both of which are slotted. One slotted end of the link 66 receives the pin 62 on the end of the cutter blade 46 as shown in FIG. 4. The other slotted end receives a pin of a clevis 68 that projects through a slot in the base plate 12. The clevis 68 is attached to the end of a piston rod of a pneumatic motor 70 that is mounted on top of the base plate 12. Reciprocation of the piston rod rocks the link 66 back and forth to reciprocate the cutter blade 46.

The horn 48 has a flat round bottom face 71 and also includes an inverted funnel shaped orifice 72 that opens onto the bottom face 71 for routing wire 38 onto a bus plate in order to manufacture bus plate assemblies of the type that are disclosed in the U.S. Pat. No. 4,684,765 granted to Lawrence R. Beck, Andrew J. Kocjan, Richard A. Natoli and Louis J. Liguore Aug. 4, 1987.

Electrical Bus Assembly

Figure 5:
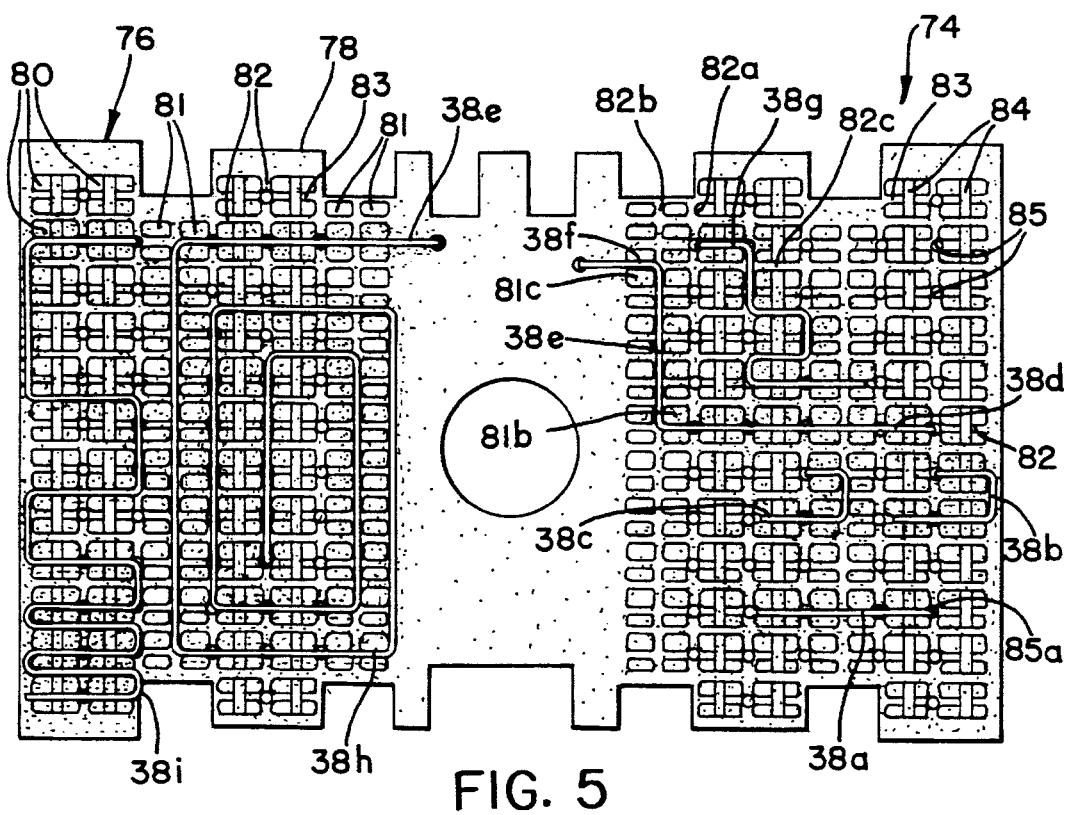
FIG. 5 is a plan view of an electrical bus assembly manufactured in accordance with the invention.

The wire routing device 10 is used to manufacture electrical bus assemblies such as the electrical bus assembly 74 that is shown in FIG. 5. The electrical bus assembly comprises a bus insulation plate 76 of thermoplastic material and lengths of electrically conductive wire 38a, 38b, 38c, etc. The bus insulation plate 76 has a flat base 78 and a plurality of integral islands on the flat base 78 that provide terminal stations 80 and guide stations 81. The terminal stations 80 and guide stations 81 are separated from each other so as to provide a network of wire receiving channels 82 that communicate with wire passages 83 that extend through the terminal and guide stations. The terminal stations 80 also have terminal slots 84 that extend through the insulation plate 76 and intersect the wire receiving passages 83. These slots receive insulation displacement terminals that establish electrical connections with the electrically conductive wires in the wire passages 83. The insulation displacement terminals have been omitted for clarity, however, a detailed description of suitable terminals is given in U.S. Pat. No. 4,684,765 granted to Lawrence R. Beck, Andrew J. Kocjan, Richard A. Natoli and Louis J. Liguore Aug. 4, 1987 that is discussed in the introduction of this patent specification.

The insulation plate 76 also has a plurality of small round holes 85 that extend through the base 78 for starting the electrically conductive wires 38a, 38b, 38c, etc.

Routing Operation

The electrically conductive wires 38a, 38b, 38c, etc are routed onto the bus insulation plate 78 by the non-rotating wire routing device 10 of this invention. FIGS. 6A, 6B, 6C and 6D illustrate the non-rotating wire routing device 10 during various stages of routing conductor wire onto the bus insulation plate 76 to manufacture the electrical bus assembly 74 shown in FIG. 5. More particularly these figures show the sequence for routing wire 38 onto the bus insulation plate 76 to form a short, straight conductor wire 38 a.

Figure 6A:
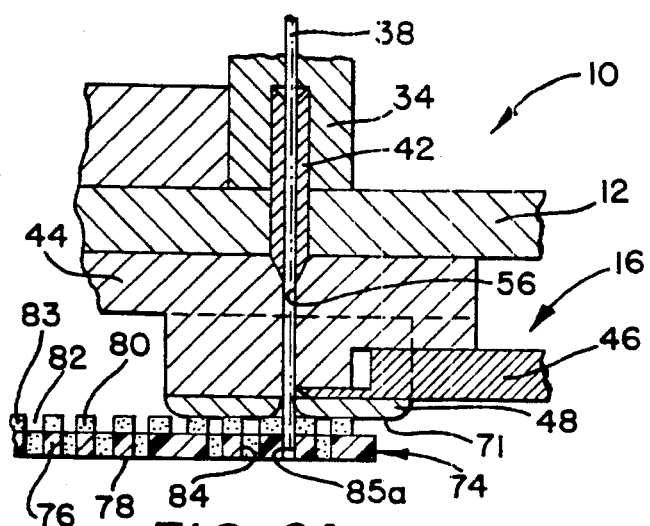
FIGS. 6A, 6B, 6C and 6D are side views of the non-rotating wire routing device of this invention during various stages of routing conductor wire onto a bus insulation plate to manufacture the electrical bus assembly shown in FIG. 5.
Figure 6B:
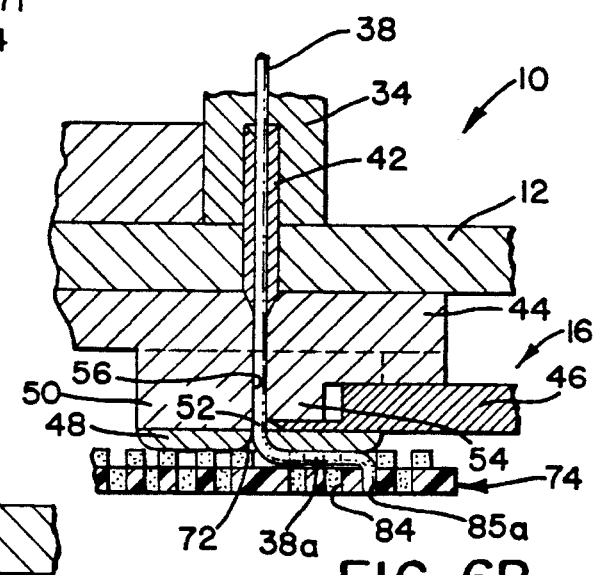

The bus insulation plate 76 is secured to the table (not shown) beneath the wire routing device 10. The wire routing device 10 is then lowered until the wire routing head 16 is spaced very close to the top of the bus insulation plate 76 over a starting hole 85a. The end of the wire 38 a is then planted into the starting hole 85a of the insulation plate 76 by the wire routing device 10 as shown in FIG. 6A. The table then translates horizontally to the right from the position shown in FIG. 6A to the position shown in FIG. 6B. The wire feeding mechanism 14 pays out and preferably pushes wire 38 through the wire routing head 16 as the table translates. The inverted funnel shaped orifice 72 guides the wire 38 being paid out into the horizontal wire receiving passages 83 of a series of terminal and guide stations that communicate via transverse wire receiving channels 82 while the flat bottom face 71 of the horn 48 surrounding the exit of the orifice 72 guides the wire down into the passages 83 and interconnecting channels 82 as shown in FIG. 6B.

Figure 6C:
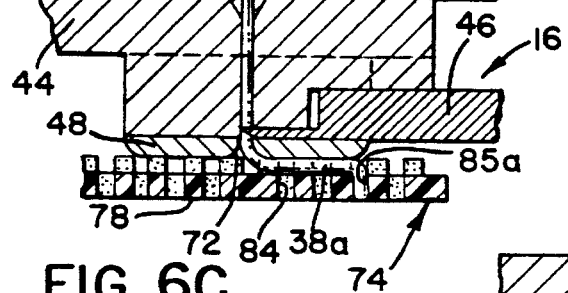
Figure 6D:
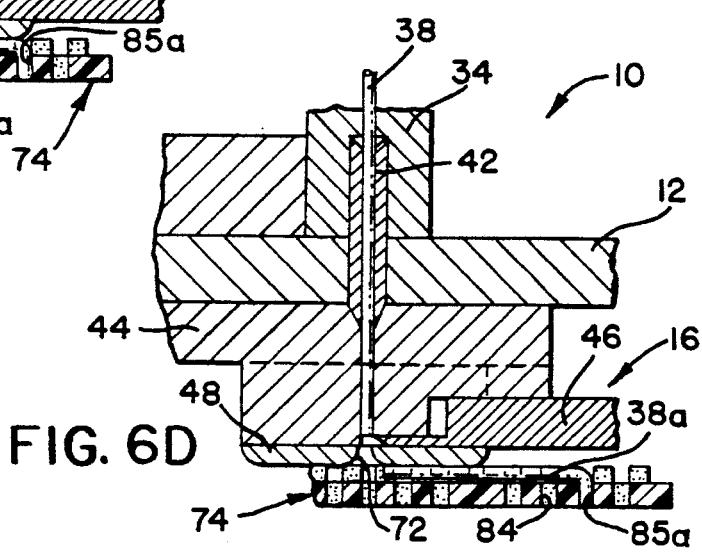

As the table continues to translate horizontally to the right and nears the desired termination of the wire conductor 38*a*, the cutter blade 46 is actuated to cut off the wire 38 being fed through the wire routing head 16 as shown in FIG. 6C. After the cut-off, the table continues translation to the right while the feeding mechanism is stopped so that the wire routing head 16 guides the cut-off end of the wire 38 into the wire receiving passage 83 as shown in FIG. 6D.

After the wire conductor 38 *a* is completed, the table can be translated to a position for starting a new wire conductor or if the wire conductor is the last one to be routed onto the insulation plate 76, the slide can be raised to remove the routed wire bussing assembly that has just been completed.

While the planting of this simple short straight conductor wire 38 *a* has been described in distinct steps, it should be understood that the table and wire routing device 10 are operated in a continuous matter.

Cornering Operation

As shown in FIG. 5, the conductor wires are routed in more complicated patterns than the short straight conductor wire 38 *a* described above. For instance the conductor wire 38*d*-38*e*-38*f* turns back and forth between a horizontal direction on an X axis and a transverse direction on a Y axis. The turning or cornering operations as the conductor wire changes from a horizontal direction to a transverse direction and back is described in connection with FIGS. 7A, 7B and 7C. These figures are enlarged side views of the non-rotating wire routing device 10 of this invention as it routes conductor wire 38 onto the bus insulation plate 76 around a corner of an island of guide station 81*b* and then around a corner of another island of guide station 81*c* to lay the conductor wire 38*d*-38*e*-38*f* during the manufacture of the electrical bus assembly shown in FIG. 5.

Figure 7A:
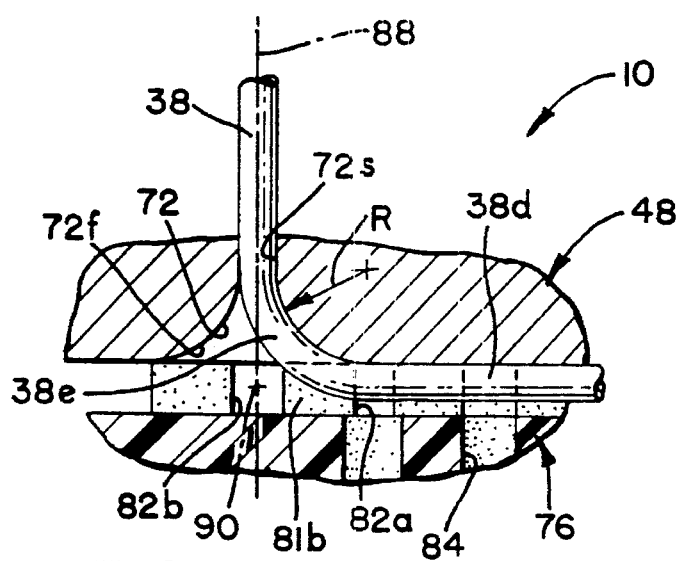
FIGS. 7A, 7B and 7C are enlarged side views of the non-rotating wire routing device of this invention during various stages of routing conductor wire onto a bus insulation plate to manufacture the electrical bus assembly shown in FIG. 5.

The conductor wire portion 38*d* is started and laid into the horizontal wire receiving passages 83 of a series of terminal and guide stations 80 and 81 that communicate via transverse or vertical wire receiving channels 82 in the same manner as described in connection with the conductor wire 38*a* until wire 38 passes guide station 81*b* and the centerline 88 of the inverted funnel aperture 72 intersects the centerline 90 of the channel 82*b* as shown in FIG. 7A. When the wire routing device 10 reaches this position, the horizontal translation of the table along the X-axis, that is, horizontal translation to the right in the plane of the paper as viewed in FIG. 7A, stops whereupon transverse translation along the Y-axis initiated, that is horizontal translation into the paper in a plane that is perpendicular to the plane of paper. As the table holding the insulation plate 76 changes direction and proceeds transversely, the wire portion 38*e* in the inverted funnel orifice 72, slides around the inverted funnel orifice so that it wraps around the corner of the island of the guide station 81*b* and enters the channel 82*b*. As the table and insulation plate 76 continue translation in the transverse direction along the Y-axis, the wire portion 38*e* is pushed into the channel 82*b* by the flat bottom face 71 of the horn 48 that surrounds the exit of the orifice 72 as shown in FIG. 7B.

As shown in FIG. 7A, the inverted funnel orifice 72 has a straight portion 72*s* of uniform diameter and an inverted funnel portion 72*f* that has a funnel radius R that sizes the funnel portion 72*f* so that it is substantially tangent to the straight portion 72*s* and the flat bottom 71. As best shown in FIG. 7A, the funnel portion 72*f* has a diameter which progressively increases proceeding from the funnel portion 72*s* toward its exit at the bottom 71 of the horn 48, the exit being located closely adjacent the bus insulation plate 76. The funnel radius R must be large enough so that the wire portion 38*e* can slide out of the inverted funnel orifice 72 easily. On the other hand the funnel radius R cannot be so large that interference between the wire portion 38*e* and the island of the guide station 81*b* is not sufficient to prevent the wire portion 38*e* entering the adjacent channel 82*a* instead of channel 82*b* when the table and insulation plate 76 change direction.

It has been found that, as a practical matter, the inverted funnel radius is preferably about 1 mm and cannot exceed about 2 mm based on studies conducted with 20 gage copper wire (approximately 0.80 mm diameter) that was fed through a feed tube of about 1.00 mm and pushed into wire receiving channels and passages that were about 0.70 mm wide and had a minimum centerline-to-centerline spacing of about 2.25 mm.

Figure 7B:
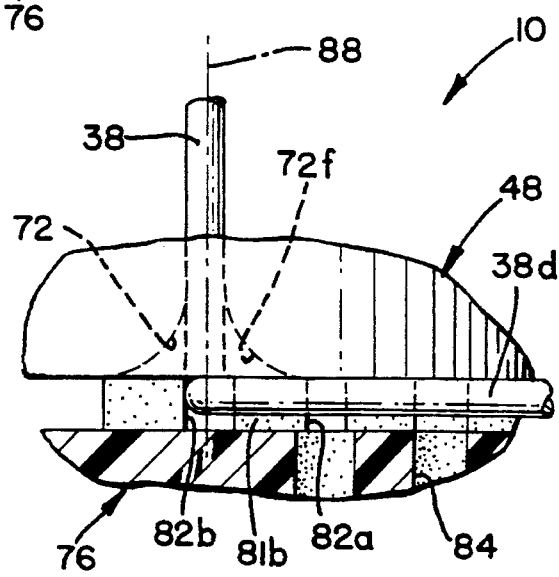
Figure 7C:
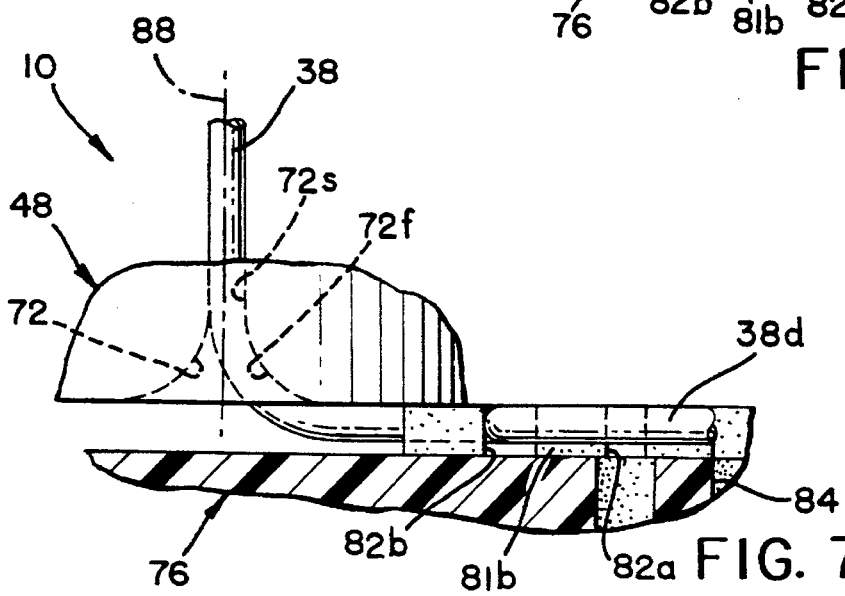

In reference to FIG. 7B, the table and insulation plate 76 continue translating in the transverse plane until the conductor wire portion 38*e* is laid into the transverse wire receiving channel 82*b* until wire 38 passes guide station 81*c* and the centerline 88 of the inverted funnel aperture 72 intersects the centerline of the channel 82*c* shown in FIG. 5. When the wire routing device 10 reaches this position, the transverse translation of the table along the Y-axis stops whereupon horizontal translation along the X-axis resumes. As the table holding the insulation plate 76 changes direction and proceeds horizontally to the right, the wire portion 38 in the inverted funnel orifice 72, slides around the inverted funnel orifice so that it wraps around a corner of the guide station 81*c* and enters the channel 82*c*. As the table and insulation plate 76 continue translation this wire portion is pushed into the channel 82*c* by the flat bottom face 71 of the horn 48 as before to provide the conductor wire portion 38*f* that is shown in FIGS. 5 and 7C.

The above cornering operations have been described as separate translational steps, for instance, a horizontal translation and then a transverse translation. However, a more continuous operation where the translation in the new direction begins slowly as the translation in the old direction slows down to a halt is also possible and preferred.

From the foregoing descriptions and FIG. 5, it can be seen that virtually any shape of wire conductor 38 can be routed onto the insulation board 76 by combinations of straight and cornering operations that are described above. Moreover, the cornering operations are not limited to orthogonal paths because the wire can be routed onto any curved, angular or other non-linear path as necessary.

The lowering and raising of the slide, the translation (direction and speed) of the table and the operation of the wire feeding mechanism and the cutter blade can be controlled and coordinated by any suitable programmable control device so that a very large variety of bussing assemblies are possible.

It should be noted that the wire routing head 16 continues to press previously laid conductor wires into the wire receiving channels and passages as new conductor wires are being laid because the relatively large flat bottom face 71 overlies several channels and passages near the one into which the conductor wire is being laid.

The invention has been described in an illustrative manner, and it is to be understood that the terminology which has been used is intended to be in the nature of words of description rather than of limitation.

Obviously, many modifications and variations of the present invention in light of the above teachings may be made. It is, therefore, to be understood that, within the scope of the appended claims, the invention may be practiced otherwise than as specifically described.

The embodiments of the invention in which an exclusive property or privilege is claimed are defined as follows:

1. A wire routing device (10) for routing conductor wire onto a bus plate to manufacture routed wire bussing assemblies comprising:

a base plate (12) supporting a wire feed mechanism (14) and a wire routing head (16), the wire routing head (16) comprising a horn plate (44) and a horn (48) that are non-rotatably secured to the base plate (12), the horn plate (44) having a depending rib (50) that has two steps that provide an anvil riser (52) beneath an intermediate guide step (54) and a through bore (56) that is chamfered at its upper end to receive a tip of a feed tube (42) and whose bottom end opens onto the guide step (54) next to the anvil riser (52), the wire routing head (16) further comprising a cutter blade (46) having a hollow end (58) that is guided on the guide step (54) and that has a lower cutting edge (60) that cooperates with the anvil riser (52) to cut off wire that is being fed through the through bore (56), the horn (48) having a disk shaped body that is fastened to the underside of the horn plate (44) over the depending rib (50) and that has a longitudinal slot (64) that receives the depending rib (50) and the cutting end of the cutter blade (46) when it is fastened in place, and the horn (48) having an inverted funnel shaped orifice (72) including an inverted funnel shaped portion (72f) whose diameter progressively increases toward an exit end for routing wire (38) onto an adjacently located bus plate (76) having islands defining a network of wire receiving channels and passages in order to manufacture bus assemblies.

2. The wire routing device as defined in claim 1 wherein the inverted funnel shaped portion (72f) has a funnel radius (R) that sizes the funnel portion (72f) so that interference between a wire portion (38c) and an island of the bus plate is sufficient to wrap the wire portion (38c) around an island and enter a transverse wire receiving channel or passage when translation of the bus plate (76) changes to a transverse direction and to prevent the wire portion (38c) jumping the island and entering an adjacent transverse wire receiving channel or passage.

3. The wire routing device as defined in claim 2 wherein the inverted funnel shaped orifice (72) comprises a straight portion (72s) of uniform diameter and the inverted funnel shaped portion (72f) is substantially tangent to the straight portion 72s and a round flat bottom face (71) of the horn (48) that surrounds said exit end of the inverted funnel shaped portion (72f).

4. The wire routing device as defined in claim 3 wherein the funnel radius (R) does not exceed about 2 mm.

5. The wire routing device as defined in claim 3 wherein the reverse funnel radius (R) does not exceed 2 mm. for 20 gage wire diameter that is being fed through a feed tube of approximately 1.00 mm and pushed into wire receiving channels and passages that are approximately 0.70 mm wide and have a minimum centerline-to-centerline spacing of approximately 2.25 mm.

6. The wire routing device as defined in claim 1 wherein the cutter blade (46) reciprocates in the slot (64) guided by the guide step (54) that fits slidably into the hollow end (58) of the cutter blade (46) and the cutter blade (46) is reciprocated by a link (66) having slotted ends and which is pivotally mounted on the base plate (12) between its slotted ends, one slotted end of the link (66) receiving a pin (62) on an end of the cutter blade (46) and the other slotted end receiving a pin of a clevis (68) that is attached to an end of a reciprocating rod that pivots the link (66) back and forth to reciprocate the cutter blade (46).

7. A wire routing device (10) for routing wire onto a support comprising:

a base plate (12) supporting a wire feed mechanism (14) and a wire routing head (16), the wire feed mechanism having a wire guide (34), and means for pushing wire (38) in the wire guide (34) into the wire routing head (16), the wire routing head (16) comprising a feed tube (42) that is attached to the wire guide (34) and a horn (48) that is non-rotatably attached to the base plate (12), the horn (48) having an inverted funnel shaped orifice (72) including an inverted funnel shaped portion (72f) whose diameter progressively increases toward an exit end located adjacent said support for routing wire (38) received from the wire feed mechanism onto said support in a non-linear pattern without any need for rotating the horn with respect to the support, said horn having a bottom surface surrounding the exit end of the inverted funnel shaped orifice (72) for guiding the wire onto said support.

8. The wire routing device as defined in claim 7 wherein the inverted funnel portion (72f) has a funnel radius (R) that does not exceed about 2 mm.

9. The wire routing device as defined in claim 7 wherein the an inverted funnel portion (72f) has a funnel radius (R) of about 1 mm.

10. The wire routing device as defined in claim 9 wherein the inverted funnel shaped orifice (72) comprises a straight portion (72s) of uniform diameter and the inverted funnel shaped portion (72f) is substantially tangent to the straight portion 72s and a round flat bottom face (71) of the horn (48) that surrounds the exit end of the inverted funnel shaped orifice (72).

11. A wire routing device (10) for routing conductor wire onto a bus plate to manufacture routed wire bussing assemblies comprising:

a base plate (12) supporting a wire feed mechanism (14) above the plate and a wire routing head (16) below the plate, the wire feed mechanism having a wire guide (34) and means for pushing wire (38) that is inserted into the wire guide (34) into the wire routing head (16), the wire routing head (16) comprising a feed tube (42) that is attached to the wire guide (34) and a horn plate (44) and a horn 48 that are non-rotatably attached to the base plate (12), the horn (48) having an inverted funnel shaped orifice (72) including an inverted funnel shaped portion (72f) whose diameter progressively increases toward an exit end located adjacent the bus plate for routing wire (38) received from the wire feed mechanism onto the bus plate in linear and non-linear patterns in order to manufacture bus assemblies without any need for rotating the wire routing head with respect to the bus plate, said horn having a bottom surface (71) that surrounds the exit end of the inverted funnel shaped portion (72f) to guide the wire onto the support.

12. The wire routing device as defined in claim 11 wherein the inverted funnel shaped portion 72f has a funnel radius (R) that sizes the funnel shaped portion 72f so that interference between a wire portion (38c) and an island of the bus plate is sufficient to wrap the wire portion (38c) around an island and enter a transverse wire receiving channel when translation of the bus plate (76) changes to a transverse direction and to prevent the wire portion (38c) jumping the island and entering an adjacent transverse wire receiving channel.

13. The wire routing device as defined in claim 12 wherein the inverted funnel shaped orifice (72) comprises a straight portion ((72s) of uniform diameter and the inverted funnel shaped portion (72f) is substantially tangent to the straight portion 72s and wherein said bottom surface is a round flat bottom face (71) of the horn (48) that surrounds the exit end of the inverted funnel shaped portion (72f).

14. The wire routing device as defined in claim 13 wherein the funnel radius (R) does not exceed 2 mm.

15. The wire routing device as defined in claim 13 wherein the funnel radius (R) does not exceed 2 mm. for 20 gage wire diameter that is being fed through a feed tube of approximately 1.00 mm and pushed into wire receiving channels and passages that are approximately 0.70 mm wide and have a minimum centerline-to-centerline spacing of approximately 2.25 mm.

16. The wire routing device as defined in claim 11 wherein the horn plate (44) has a depending rib (50) that has two steps that provide an anvil riser (52) beneath an intermediate guide step (54) and a through bore (56) that is chamfered at its upper end to receive a tip of the feed tube (42) and that opens onto the guide step (54) next to the anvil riser (52), the wire routing head (16) further comprising a cutter blade (46) having a hollow end (58) that is guided on the guide step (54) and that has a lower cutting edge (60) that cooperates with the anvil riser (52) to cut off wire that is being fed through the through bore (56), the horn. (48) having a disk shaped body that is fastened to the underside of the horn plate (44) over the depending rib (50) and that has a longitudinal slot (64) that receives the depending rib (50) and the cutting end of the cutter blade (46) when it is fastened in place, the cutter blade (46) reciprocates in the slot (64) guided by the guide step (54) that fits slidably into the hollow end (58) of the cutter blade (46) and the cutter blade (46) is reciprocated by a link (66) having slotted ends and which is pivotally mounted on the base plate (12) midway between its slotted ends, one slotted end of the link (66) receiving a pin (62) on one end of the cutter blade (46) and the other slotted end receiving a pin of a clevis (68) that is attached to an end of a reciprocating rod that rocks the link (66) back and forth to reciprocate the cutter blade (46).

17. A method of routing wire onto a support comprising:

placing the support beneath a wire feed mechanism (14) and a wire routing head (16), the wire routing head (16) having a horn (48) that has an inverted funnel shaped orifice (72) including a funnel shaped portion (72f) whose diameter progressively increases to an exit end located adjacent the support for routing wire (38) onto the support in a non-linear pattern without any need for rotating the horn with respect to the support, and wherein the horn has a bottom surface which surrounds said exit end for pressing the wire onto said support, and translating the support with respect to the wire feed mechanism (14) and the wire routing head (16) so that the wire routing head (16) routes wire (38) onto the support in a predetermined pattern when wire (38) is fed through the inverted funnel shaped orifice (72) by the wire feed mechanism (14).

18. The wire routing method as defined in claim 17 wherein the bottom surface of the horn (48) is a flat bottom face (71) that surrounds the exit end of the inverted funnel shaped portion (72f) and presses wire (38) into wire receiving channels and passages of the support.

19. The wire routing method as defined in claim 18 wherein the wire feeding mechanism (14) pushes the wire (38) through the inverted funnel shaped orifice (72).

20. The wire routing method as defined in claim 19 wherein the inverted funnel shaped portion (72f) has a funnel radius (R) that does not exceed 2 mm.

21. The wire routing device as defined in claim 20 wherein the inverted funnel shaped portion (72f) has a funnel radius (R) of approximately 1 mm.

22. The wire routing method as defined in claim 17 wherein the wire feeding mechanism (14) pushes the wire (38) through the inverted funnel shaped orifice (72).

* * * * *